United States Patent [19]

Swart

[11] Patent Number: 5,447,442

[45] Date of Patent: Sep. 5, 1995

[54] COMPLIANT ELECTRICAL CONNECTORS

[75] Inventor: Mark A. Swart, Upland, Calif.

[73] Assignee: Everettt Charles Technologies, Inc., Pomona, Calif.

[21] Appl. No.: 126,179

[22] Filed: Sep. 23, 1993

Related U.S. Application Data

[63] Continuation-in-part of Ser. No. 9,133, Jan. 26, 1993, Pat. No. 5,389,885, which is a continuation-in-part of Ser. No. 827,023, Jan. 27, 1992, Pat. No. 5,252,916.

[51] Int. Cl.⁶ .............................................. H01R 9/09
[52] U.S. Cl. ...................................... 439/77; 439/700
[58] Field of Search ............... 439/67, 77, 492, 493, 439/66, 91, 840, 825, 700

[56] References Cited

U.S. PATENT DOCUMENTS

| | | | |
|---|---|---|---|
| 2,210,418 | 8/1940 | Larson | 173/324 |
| 3,363,220 | 1/1968 | Redd et al. | 339/176 |
| 3,951,494 | 4/1976 | Romine | 339/17 L |
| 4,417,776 | 11/1983 | Motoyama | 439/77 |
| 4,508,405 | 4/1985 | Damon et al. | 373/215 |
| 4,620,761 | 11/1986 | Smith et al. | 339/75 MP |
| 4,881,901 | 11/1989 | Mendenhall et al. | 439/65 |
| 5,055,055 | 10/1991 | Bakker | 439/78 |
| 5,151,047 | 9/1992 | Phillips | 439/333 |
| 5,154,628 | 10/1992 | Skegin | 439/336 |
| 5,159,265 | 10/1992 | Alfonso et al. | 324/158 |
| 5,174,763 | 12/1992 | Wilson | 439/66 |
| 5,197,890 | 3/1993 | Seymour | 439/67 |
| 5,295,839 | 3/1994 | Grange et al. | 439/67 |

*Primary Examiner*—David L. Pirlot
*Attorney, Agent, or Firm*—Christie, Parker & Hale

[57] ABSTRACT

A compliant electrical connector includes a housing, a flexible diaphragm contained in the housing providing independent spring biased pressure contact for movable solid metal contact pins mounted in the housing, and separate electrical leads in the housing for making electrical contact with the movable contact pins and providing terminals for transmitting electrical signals from the contact pins to the exterior of the housing for surface mount contact with corresponding electrical circuits in an external electric/electronic device. In one embodiment, the contact pins are electrically connected internally to separate circuit traces on a flex circuit extending to the outside of the connector housing. The contact pins can be connected directly to the flex circuit, or the housing can contain separate conductive barrels for sliding contact with the contact pins, in which the barrels are electrically connected to the circuit traces. The contact pins can be connected to the flex circuit directly through separate flexible fingers contained on the flex circuit to move with corresponding travel of the contact pins. In a further embodiment, the flexible diaphragm can be replaced with separate compression springs contained in electrically isolated cavities and biased into direct spring contact with the contact pins.

30 Claims, 10 Drawing Sheets

COMPLIANT ELECTRICAL CONNECTORS

CROSS-REFERENCE TO RELATED APPLICATIONS

This is a continuation-in-part of application Ser. No. 08/009,133, now U.S. Pat. No. 5,389,885 filed Jan. 26, 1993, which is a continuation-in-part of application Ser. No. 07/827,023, filed Jan. 27, 1992 now U.S. Pat. No. 5,252,916. These prior applications are incorporated herein by this reference.

FIELD OF THE INVENTION

This invention relates to compliant electrical connectors, and in one embodiment, the connector includes a housing containing a compliant element, such as an elastomeric diaphragm, for applying independent spring forces to solid metal contacts on the connector.

BACKGROUND OF THE INVENTION

The present invention relates to compliant electrical connectors for making spring-biased electrical contact between mating electrical connectors, particularly "high cycle life" connectors that are repeatedly connected and disconnected during use. The invention provides a high reliability connector that can be connected and disconnected for thousands of cycles without adversely affecting the electrical integrity of the connection. The invention also is characterized by inexpensive means for making various embodiments of these high cycle life, high reliability compliant electrical connectors.

The compliant connectors of this invention can be used in any of numerous portable applications involving mating electrical connectors subject to repeated use. Many prior high cycle life connectors are subjected to strong wiping action during use. This can lead to excessive wear and resulting unreliable connections. Many of these connectors have a compliant element for retaining spring pressure contact during use. Certain compliant connectors do not have long term reliability. For instance, in some connectors the compliant element is provided by compressible rubber blocks or conductive rubbers that take a set and thereby experience loss of necessary compliancy during use.

The present invention does not relate to the familiar electrical plug and receptacle connectors in which fixed (non-movable) connectors projecting from a plug are inserted into cooperating electrical receptacles in the mating connector. The connectors of this invention are of a type in which one connector has movable solid metal contact pins that make compliant surface contact with fixed electrical terminals on the mating connector. These terminals on the mating connector are not the receptacle type, but rather, comprise surface contact terminal means such as protruding solid metal pins, flat solid metal pads, or thin metal circuit traces on either printed circuit boards or on flexible carrier films referred to in the art as "flex circuits." The compliant connector of this invention has contact pins that make releasable spring-biased surface contact with the fixed contacts or conductors on the mating connector. These compliant connections retain their electrical contact integrity sufficiently to ensure continuous reliable electrical contact during use. The invention is particularly useful in maintaining high reliability compliant connections in high vibration environments.

As mentioned, the compliant electrical connectors of this invention can be used for a wide variety of applications involving repeated connecting and disconnecting of the connector from a mating electrical connector. One use of the invention is for a battery pack installed on a cellular telephone for producing good spring-biased contact between the pins of the connector and the terminals on the battery pack. Similar uses include batteries that may be used in any electronic or electrical device that operates on batteries requiring frequent removal and reinstallation. Other uses of the connector can include portable electronic notebooks for connecting to removable memory modules that plug into the notebook, lap top computers for plugging into a computer docking station, or various electronic devices that are inserted into a battery charger for electrically connecting the electronic device to the recharger. In some applications, the invention can be used where high reliability interconnections of mating printed circuit boards are required. The connector also is useful in environments subject to high vibrational forces during use, and one such use of the connector is for making reliable electrical connections between an ink-jet cartridge and an ink-jet printer.

SUMMARY OF THE INVENTION

Briefly, one embodiment of this invention provides a compliant electrical connector for making surface contact with rigid electrical contacts on a mating electrical connector to provide high reliability spring-biased electrical contact between the two connectors. The compliant electrical connector includes a housing containing movable electrically conductive contact pins extending through respective passages in the housing that support the contact pins in a pattern corresponding to that of the rigid electrical contacts on the mating electrical connector. The contact pins have external contact ends protruding from a common exterior face of the housing. A contact end of each supported contact pin is aligned for contact with the corresponding rigid contact on the mating connector. An opposite compliancy control end of each contact pin directly contacts a thin, flexible elastomeric diaphragm mounted inside the housing. The diaphragm is normally supported in a fixed position by a rigid internal supporting surface contained in the housing. The diaphragm is freely elastically movable away from its supported position in the housing in response to axial pressure contact from the compliancy control ends of the contact pins. The connector further includes terminals electrically connected to the movable contact pins inside the housing. The terminals are supported in the housing by the supporting surface and are located between the elastomeric diaphragm and the supporting surface. The terminals can include corresponding electrical leads extending to the outside of the connector housing for electrical connection to an external electrical/electronic device.

In one embodiment, the movable contact pins are solid metal pins making electrical contact with terminals comprising corresponding passive circuit traces contained on a flexible circuit film in the housing and extending to the outside of the housing. The movable contact pins can be electrically connected directly to the circuit traces on the flexible circuit film, or they can be contained in corresponding conductive barrels in the housing which in turn contact the circuit traces on the flexible circuit film.

As a further alternative, the means for making electrical contact between the moving contact pins and the external electrical/electronic device can comprise separate solid metal wiper arms contained in respective passages within the housing for sliding contact with the movable contact pins. These conductive wiper arms extend to the exterior of the housing for making electrical contact with external circuits, such as by surface mount techniques.

In a further embodiment, in some applications, it may be desirable to use separate conductive coil springs as a means of spring-biasing the movable contacts of the connector, as opposed to the elastomeric diaphragm means of compliance.

In certain embodiments of the invention, a rigid housing cover is mounted over the internal supporting surface inside the housing and in contact with the elastomeric diaphragm for retaining the diaphragm in the housing. The cover has separate cavities on a side of the diaphragm opposite from the movable contact pins. The diaphragm can move freely into each the cavity independently when the contact pins are spring-biased into compliant contact with corresponding contacts on the mating connector. The rigid portions of the housing between cavities can hold the diaphragm in a fixed position against the internal supporting surface so that the diaphragm is stretched into each cavity only from the travel of each independent contact pin making contact with the mating connector.

The invention provides a high reliability electrical connector that holds the movable contact pins in compliant electrical engagement with the fixed contacts on a corresponding mating electrical connector. The design of the connector in several of its embodiments ensures reliable continuous spring-biased contact even in environments where the connectors are subjected to extreme vibrational conditions during use.

As a further advantage, the invention, in certain embodiments, provides a low profile connector which can be used as a printed circuit board interconnect that can improve the desired low-profile designs of electronic devices in which the PCB's are used.

These and other aspects of the invention will be more fully understood by referring to the following detailed description and the accompanying drawings.

DETAILED DESCRIPTION

Figure 1:
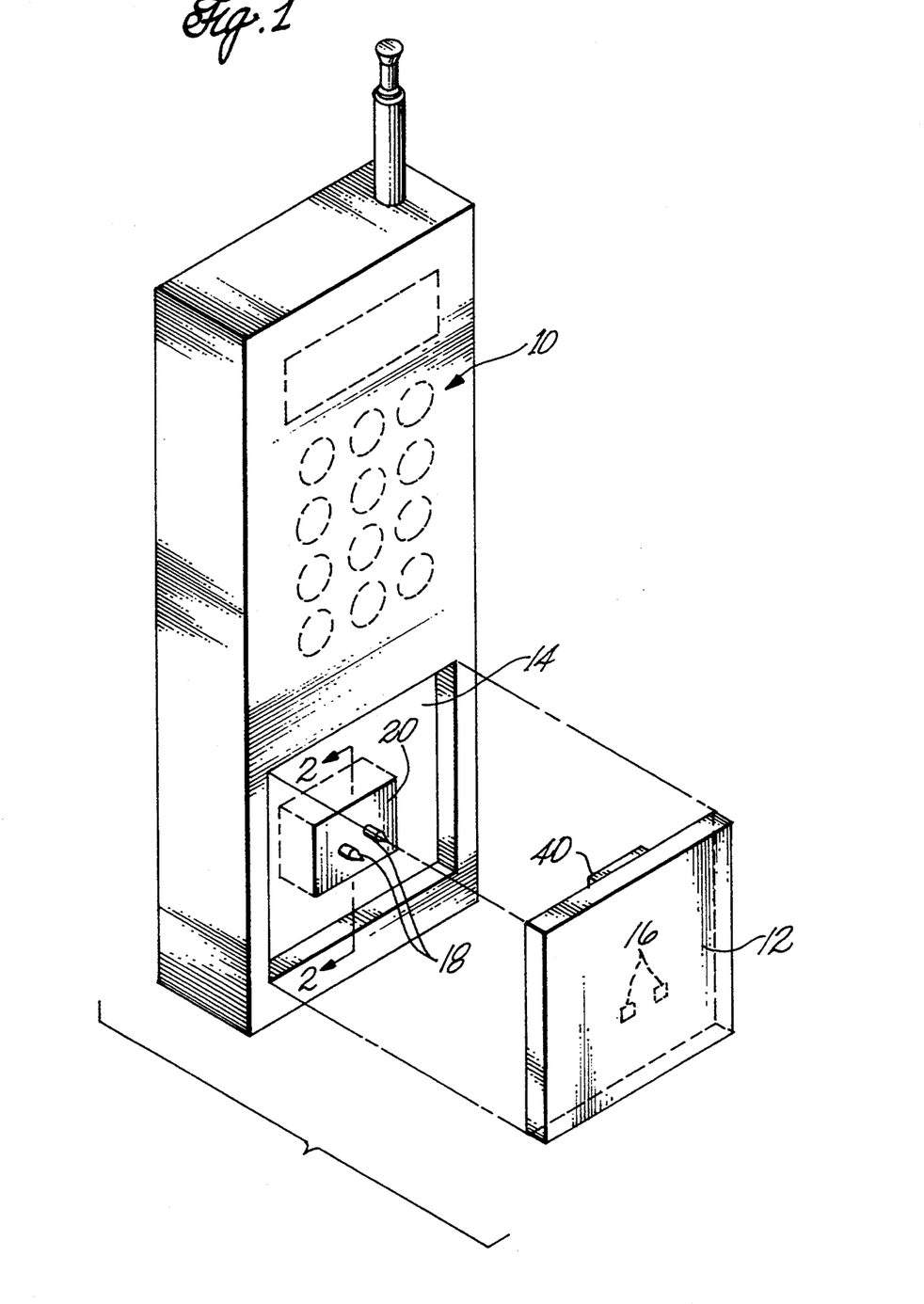
FIG. 1 is an exploded perspective view showing the rear side of a portable cellular telephone and a battery pack having a compliant electrical connector of this invention.
Figure 2:
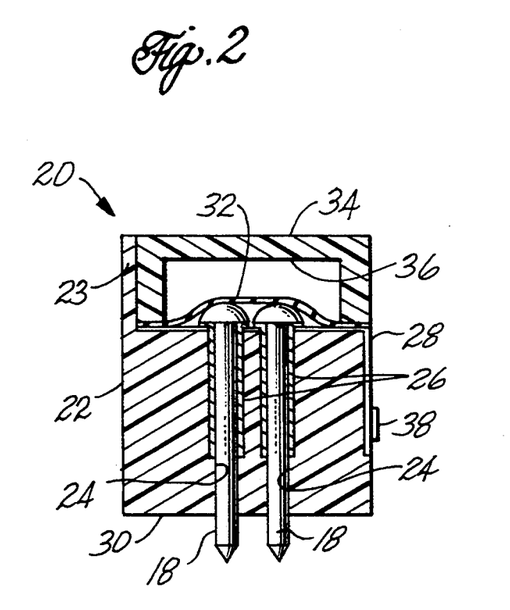
FIG. 2 is an inverted cross-sectional view taken on line 2—2 of FIG. 1 showing the connector used for a battery pack interface to the portable cellular telephone.

FIGS. 1 and 2 illustrate one application of a compliant electrical connector of this invention. The connector is used in a portable cellular telephone 10 having a battery pack 12 installed in a recess 14 on a rear side of the cellular telephone for supplying electrical power for the operation of the telephone. Battery voltage terminals 16 on a rear side of the battery pack electrically contact corresponding spring biased telephone voltage terminals 18 on the rear side of the telephone 10 when the battery is installed in the telephone. The spring biased terminals 18 are on a connector 20 of this invention installed in the body of the telephone.

The connector 20 containing the telephone voltage terminals 18 is located on the lower rear side of the telephone 10. Referring to FIG. 2, the connector 20 has a housing 22 having a generally rectangular cross sectional configuration. An arm 23 projects up from a top side of the connector, perpendicular to the connector's top face. The housing 22 is made of a solid unitary piece of a sturdy, rigid electrically insulating material, such as G-10 fiberglass. The housing 22 has a plurality of separate bores 24 drilled on a fixed pattern through the depth of the housing and opening to the top and bottom faces of the housing. The bores 24 are drilled in a pattern corresponding to the pattern of terminals 16 on the battery pack. A separate electrically conductive barrel 26 is press fitted into each bore.

A flexible ribbon cable or circuit cable 28 (referred to herein as a flex circuit) has separate circuit traces connected to the conductive barrels contained in the housing. The flex circuit 28 has a right-angle shape and is laminated to the top face and an exterior side wall of the housing 22. Each barrel 26 has a flange that pierces a circuit trace on the flex circuit and seats the flange to the circuit trace to form an electrical connection. The flex circuit 28 has electrically conductive passive circuit traces that connect each barrel 26 on the top face of the housing 22 to a corresponding telephone voltage terminal 38 in the form of a solid metal pad on the portion of the flex circuit on the exterior side wall of the housing.

The spring biased terminals 18 are solid metal contact pins movable axially in each of the barrels. The pins are movable on the inside of the barrels 26 for making sliding electrical contact. The pins 18 have a sharp tip on an end projecting away from a bottom face 30 of the housing 22. A round head on the opposite end of each pin projects from a top face of the housing.

A thin, flexible elastomeric diaphragm 32 is held taut against the top surface of the flex circuit 28 so that the bottom face of the diaphragm is in contact with the round heads of the pins 18. The diaphragm 32 is mounted to the housing 22 by fasteners (not shown). Alternatively, the diaphragm may be bonded at its periphery to the housing. A housing cover 34 of rectangular configuration with a downwardly opening rectangular recess 36 is mounted to the top face of the housing so that the peripheral lower wall of the cover contacts the top face of the housing. A ring shaped shield (not shown) optionally contacts the bottom face of one side of the housing to surround the projecting end portions of the pins 18. The shield can serve as a locator for a mating electrical connector that plugs into the shield for contact with the pins exposed within the shield.

The elastic diaphragm provides a spring force against the heads of the contact pins in response to axial pressure on the tips of the pins. The connector is installed in the telephone with the terminals 38 making surface mount contact with a circuit board (not shown) in the telephone. When the battery pack is installed in the recessed region at the rear face of the telephone, the terminals 16 on the battery are pressed into contact with the spring biased contact pins 18. The terminals push against the tips of the pins to thereby urge the heads of the pins into the diaphragm in response to the axial force on the pins. As the heads are urged into the diaphragm, the diaphragm stretches to thereby generate an equal and opposite axial force on the pins. This produces a good spring biased surface contact between the pins and the fixed terminals on the battery pack. This spring biased connection is retained by the battery pack latching to the recessed region on the telephone by a latch 40 on the battery pack. The connector provides an inexpensive means of making spring biased contact for the electrical connectors when the battery pack is repeatedly removed and re-installed in the housing.

In alternative embodiments, the battery may be used in any electronic or electrical device that operates on batteries requiring frequent removal and reinstallation. In other embodiments, the connector may be used in portable electronic notebooks for connecting to removable memory modules that plug into the notebook. In still further embodiments, the connector is used in electronic devices that are inserted into a battery charger for electrically connecting the electronic device to the recharger. Other uses are possible and will be more apparent from the description to follow.

Figure 3:
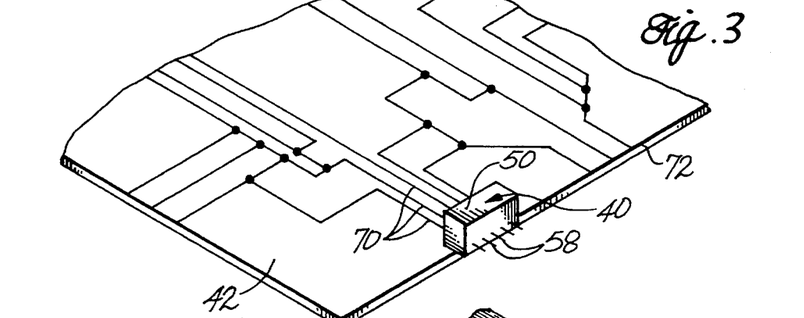
FIG. 3 is a fragmentary perspective view showing a compliant connector of this invention mounted to a printed circuit board.
Figure 4:
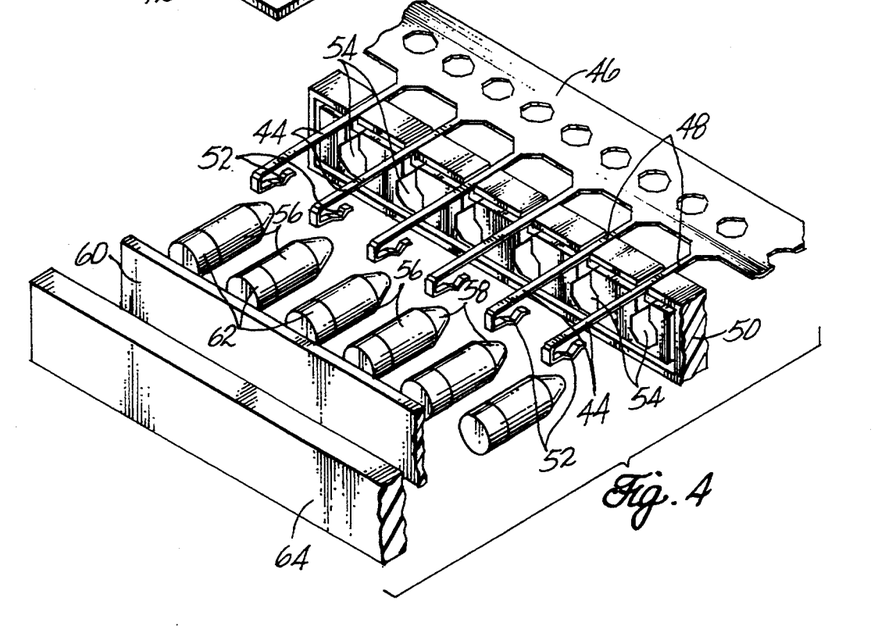
FIG. 4 is a fragmentary exploded perspective view showing components of the connector shown on FIG. 3
Figure 5:
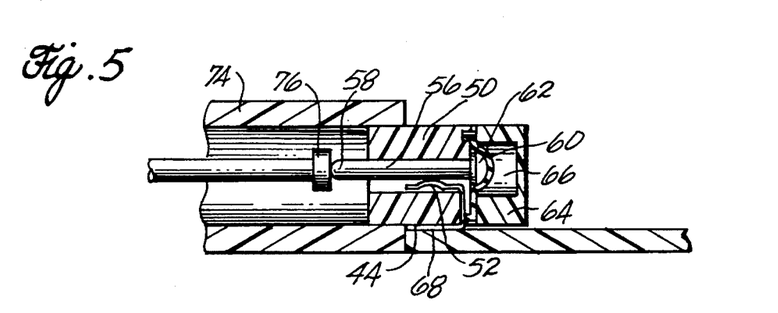
FIG. 5 is a fragmentary cross-sectional view of the connector shown in FIG. 4 coupled to a mating electrical connector.

FIGS. 3 through 5 illustrate an alternative form of the invention which includes a compliant connector 40 mounted to the edge of a printed circuit board 42. The connector includes cantilever beam-type wiper arms 44 extending parallel to one another and joined to a common lead frame 46 which acts as a holder but does not become part of the finished connector. The lead frame is positioned so that the wiper arms 44 are located in corresponding narrow exterior grooves 48 in a common housing 50. The end of each wiper arm has a U-shaped spring-loaded terminal 52. The housing includes a series of longitudinally spaced apart passageways 54 for receiving corresponding electrically conductive 56 plungers. The U-shaped terminals of the wiper arms hook over an edge of the housing adjacent to each passageway so that the terminals extend axially along one side of each internal passage. The plungers are then fitted into the passages so they make spring-loaded sliding contact with the corresponding spring-biased terminal ends of the wiper arms. Exposed end portions 58 of the plungers protrude from the common exterior face of the housing while making sliding contact with the internal spring-biased terminal portions of the wiper arms.

Compliancy is provided for the plungers by a thin, flexible expandable latex rubber diaphragm 60 which makes direct contact with the head portions of the plungers internally within the connector. The diaphragm is held in place against the heads of the plungers by a dielectric cover or end cap 64 which clamps the rubber diaphragm in place internally within the connector. As shown best in the cross-section of FIG. 5, the expandable diaphragm in its normal position stretches to conform to the shape of each head. An axial force applied to each plunger in the direction of the diaphragm during use causes the diaphragm to stretch and provide compliancy for the ends of the plungers in a manner similar to a common return spring. In response to movement of the plunger, the thin, flexible diaphragm is freely expandable into a separate open cavity 66 on the side of the diaphragm opposite from each plunger. The end cap provides separate isolated cavities, with each cavity being aligned axially with a corresponding plunger so that during use, the expandable diaphragm can freely expand or stretch into the void space of each cavity independently of the other cavities. The rigid intervening wall portions of the end cap that separate the cavities provide a means for retaining the diaphragm in an unstretched position in contact with a corresponding plunger when that plunger is not subjected to an axial force directed toward the expandable diaphragm.

Referring to FIG. 5, the U-shaped terminal end portion 52 of each wiper arm 44 is shown in contact with the plunger as the plunger slides back and forth in the passageway against the bias of the rubber diaphragm. An external end portion 68 of each wiper arm is bent to conform to the outer surface of the housing. Thus, the external portions the wiper arms on the finished connector, which are contained in the parallel exterior grooves 48, provide parallel exposed electrical terminals along one side of the housing. These exposed terminals provide surface mount means that can be connected to corresponding circuits 70 on a printed circuit board 42, so that the connector provides an edge connector mounted in a fixed position to the edge of the PCB. Alternatively, the terminals can be electrically connected to corresponding conductive thru-holes in the circuit board. The end portions of the plungers contained in the connector project outwardly away from a common edge 72 of the PCB to provide spring-loaded contacts on the connector at the edge of the PCB. A plug-type connector 74 with internal sockets can be plugged into the connector to engage the spring-loaded plungers with contacts 76 in the corresponding sockets. In one embodiment, this connector can provide an interconnect for adjoining printed circuit boards.

Figure 6:
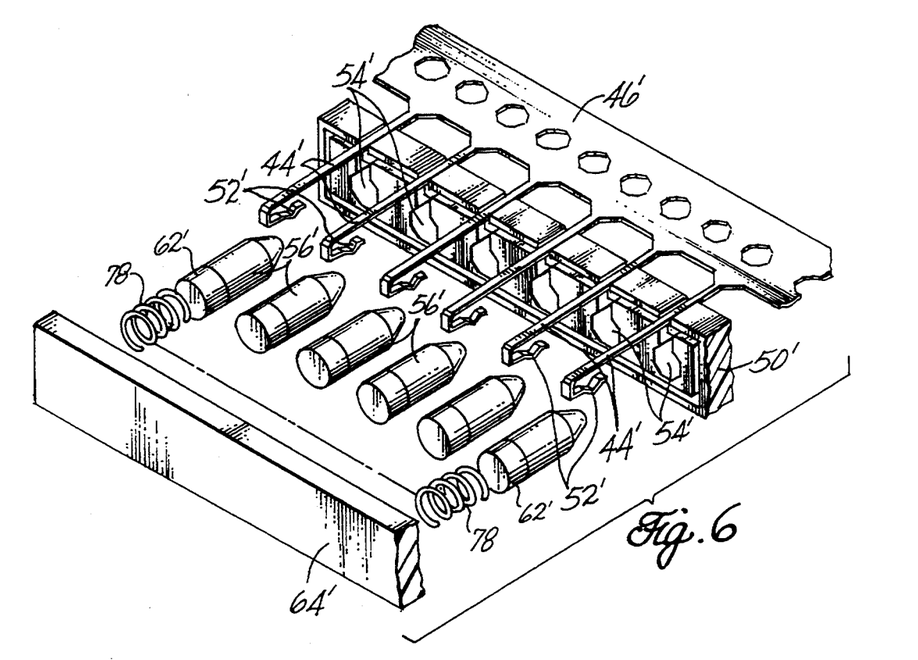
FIG. 6 is a fragmentary exploded perspective view showing components of an alternative embodiment of the connector shown in FIGS. 3 through 5.

FIG. 6 shows an alternative embodiment of the connectors shown in FIG. 3 through 5. In the FIG. 6 embodiment, the thin flexible elastomeric diaphragm is replaced with separate metal coil springs 78 that provide independent spring biasing forces on the separate plungers 62'. The springs are contained within separate cavities in the cover 64' to electrically isolate the springs and maintain them in spring bias contact with the individual head portions of the respective plungers.

The separate cavities also isolate the spring biased travel of the plungers so that each plunger can move into its corresponding cavity independently of the other plunger.

The connector of FIGS. 4 and 5, with its use of the thin, flexible elastomeric diaphragm, in certain applications can improve low-profile characteristics of a finished product since the elastomeric diaphragm can reduce the space required for the compliant element of the connector when compared with the separate compression springs.

Figure 7:
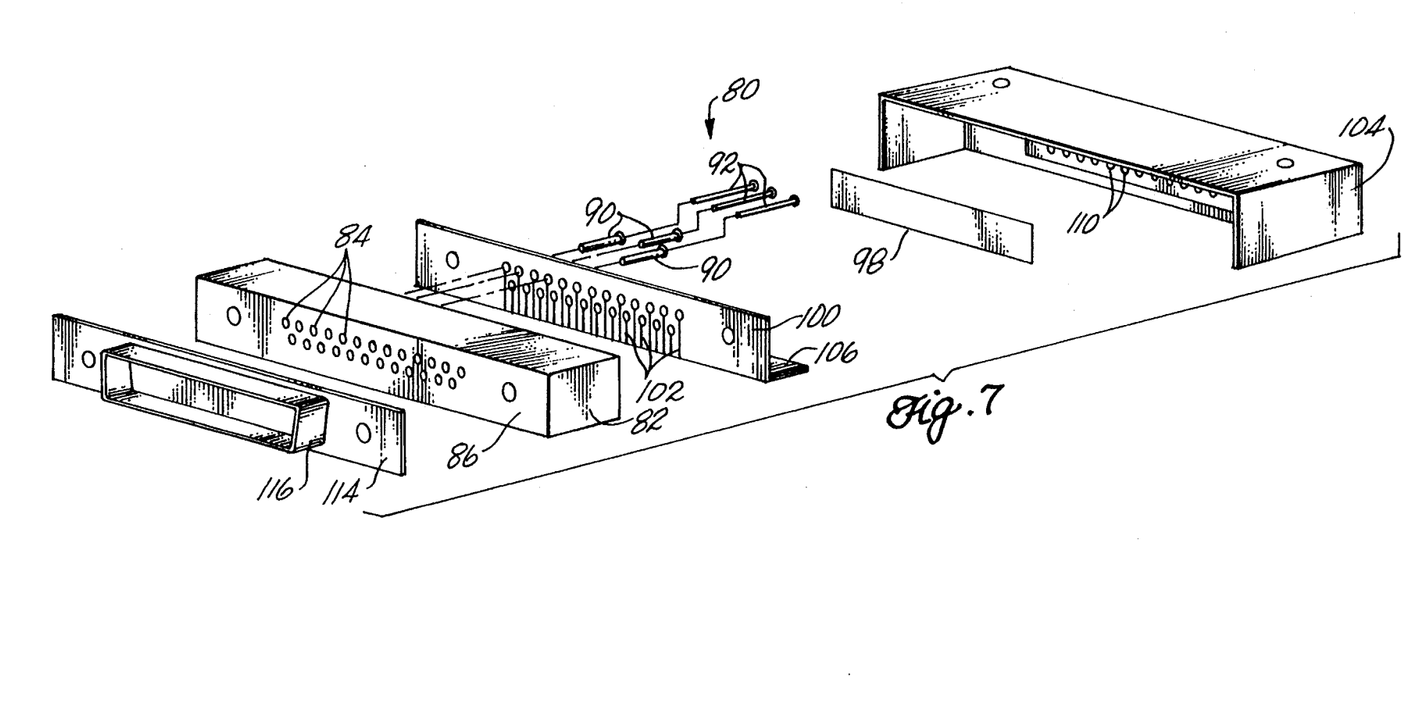
FIG. 7 is an exploded perspective view showing components of an alternative springless compliant connector according to principles of this invention.
Figure 8:
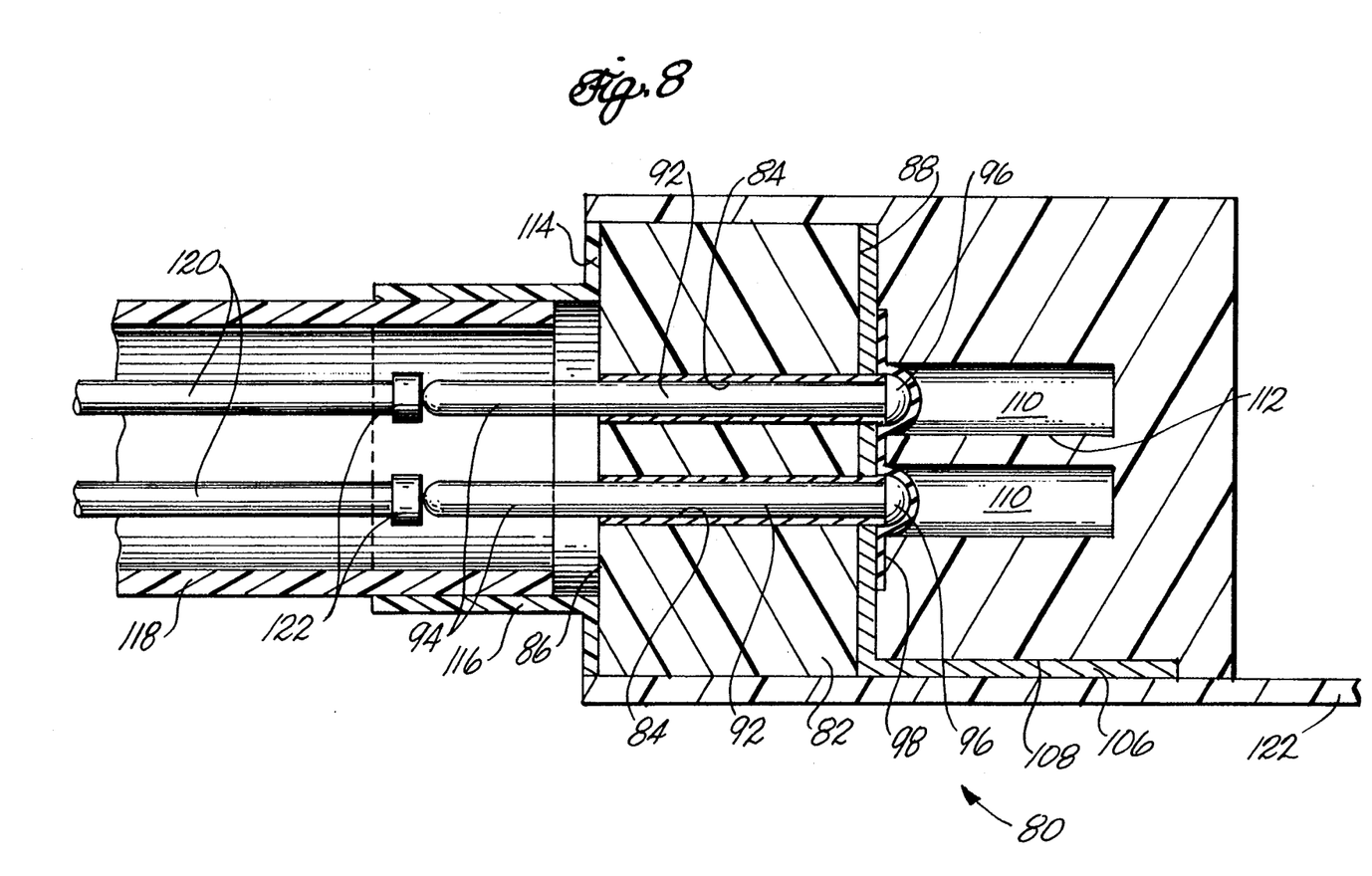
FIG. 8 is a cross-sectional view showing the connector of FIG. 7 coupled to a mating electrical connector.

FIGS. 7 and 8 show a further embodiment of the invention in which a springless compliant connector 80 includes a housing 82 made from a dielectric material. Parallel passages 84 formed in the housing open through an exterior face 86 of the housing at one end and open through a rigid flat supporting surface 88 inside the housing at the other end. Electrically conductive barrels 90 seated in the passages 84 make sliding contact with corresponding contact pins 92 slidably disposed within the barrels. Contact ends 94 of the contact pins project out from the exterior face 86 of the housing. The opposite ends of the contact pins have compliancy control ends in the form of enlarged heads 96 of the pins held in direct contact with a thin flexible elastomeric diaphragm 98. The pins project away from the flat support surface 88 and normally stretch the diaphragm into pressure contact with the heads of the pins as shown in FIG. 8. A flex circuit 100 disposed within the connector housing provides the leads for transferring electrical signals between the contact pins and the exterior of the housing. The flex circuit includes a thin, flexible dielectric sheet with electrically isolated passive circuit traces 102 for electrical contact with corresponding contact pins. FIG. 7 shows separate holes 104 in the flex circuit at the end of each circuit trace. The conductive barrels 90 are contained within the holes in the flex circuit and the barrels are mechanically bonded and thereby electrically connected to corresponding passive circuit traces 102.

As shown best in FIG. 8, the flex circuit overlies the rigid supporting surface 88 of the pin housing and is secured to its supporting surface so that it provides continuous rigid support for the entire surface area of the flex circuit contained within the interior of the housing. The elastomeric diaphragm and the flex circuit are contained within the housing by a dielectric housing cover 104 which is locked in place over the pin housing 82. The bottom of the housing cover provides downward pressure against the top peripheral edge portion of the elastomeric diaphragm to secure the diaphragm in place against the region of the flex circuit which surrounds the heads of the contact pins. The flex circuit extends to the edge of the housing and the housing cover where it makes a right angle bend so that an exterior portion 106 of the flex circuit faces outwardly along a narrow recess 108 in the housing cover. This exterior portion 106 of the flex circuit includes the circuit traces which face outwardly along the outer face of the connector housing to provide a means for a surface mount connection to an external electrical/electronic device.

The housing cover also includes separate electrically isolated cavities 110 in the form of void spaces for receiving the head portions of the contact pins and the portions of the elastomeric diaphragm that contact the head portions of the pins. As shown best in FIG. 8, the contact pins in their normal unbiased position project into the separate electrically isolated cavities, and the portions of the diaphragm in direct contact with the pins are stretched to extend upwardly into each cavity. During use, upon contact with an external electrical connector that applies an axial force to any given contact pin in a direction toward the diaphragm will cause the elastomeric diaphragm to stretch freely into the entirely open void space 110 associated with the particular contact pin. This stretched diaphragm provides a biasing force for holding the contact end 94 of the contact pin in spring biased contact with the mating electrical connector as well as providing a return force for the contact pin when the axial force is released.

By providing separate cavities for each of the contact pins, each pin is free to move independently of other contact pins in the connector, and movement of one pin into its corresponding cavity, although stretching the diaphragm portion in contact with it, does not stretch the diaphragm in contact with adjoining contact pins. Therefore, the diaphragm is stretched only in those isolated regions where a pin force is applied. The pin housing includes internal dielectric walls 112 which isolate the pin cavities 110 from one another, and the end of this wall is in pressure contact with the top of the diaphragm between the adjacent contact pins to hold that portion of the diaphragm fixed against the top of the flex circuit, supported by the underlying support surface.

A dielectric shield 114 is secured to the exterior face 86 of the pin housing. The shield 114 includes a rectangular guide wall 116 which projects away from the pin housing and surrounds the exterior contact ends 94 of the contact pins. The guide wall 116 provides an outwardly facing receptacle for receiving a complimentary end portion 118 of a mating electrical connector. This connector can include metal contact pins 120 of the type having flat rigid contact pads 122 at their ends for making mechanical and electrical contact with the contact ends 94 of the contact pins 92.

During use, an axial force applied by each mating connector pin 120 in a direction toward the elastomeric diaphragm will force the contact pin 92 to travel into the cavity 110 while stretching the portion of the diaphragm in contact with the pin to produce a biasing force in the opposing direction for retaining spring-biased contact between the ends of the two contact pins. During use, electrical contact is completed through the electrical connector 80 by each contact pin's sliding contact with its corresponding conductive barrel and through the corresponding circuit trace on the flex circuit which transfers the electrical signals to the exterior portion 106 of the flex circuit that makes surface mount contact with an external electrical/electronic device. In one embodiment the connector can be affixed to circuits on a printed circuit board 122.

To ensure reliability of the sliding contact between the contact pins and their conductive barrels, each contact pin can be side-loaded, such as by offsetting the head of the pin from its longitudinal axis.

Figure 9:
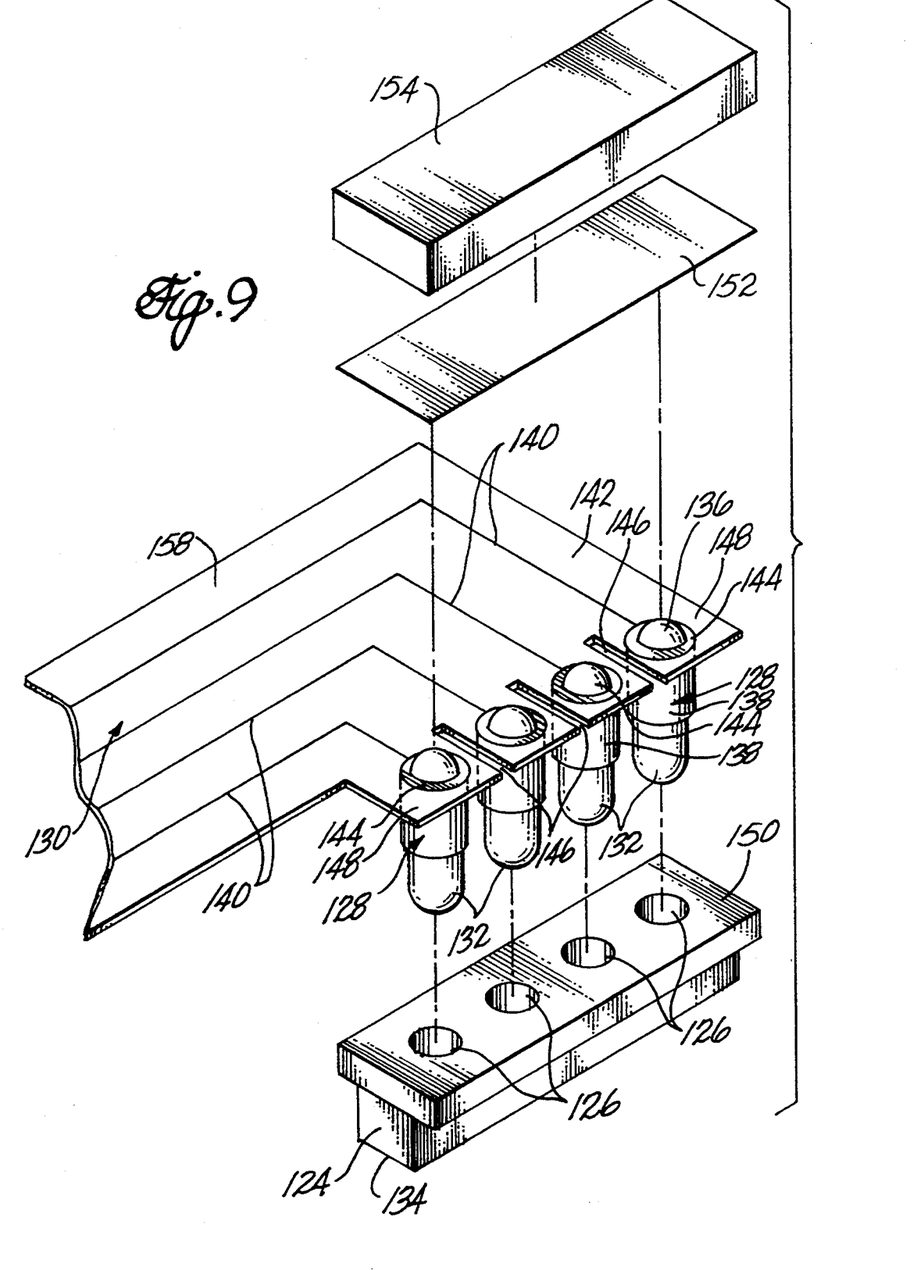
FIG. 9 is a fragmentary exploded perspective view showing a further alternative form of the invention.

FIG. 9 illustrates a further embodiment of the connector which includes a dielectric pin housing 124 having a series of passages 126 for containing separate movable plungers 128. Each plunger is mechanically bonded directly to a flex circuit 130. The plungers include exterior contact ends 132 for projecting outwardly from the exterior bottom face 134 of the housing, together with head portions 136 at the compliancy control ends of the plungers. The main cylindrical portions 138 of the plungers are contained within the passages 126 in the pin housing, and these portions of the plungers extend through respective holes in the flex circuit. The flex circuit includes separate passive circuit traces 140 carried on the flexible dielectric carrier film 142. Separate solder joints 144 on the top face of the flex circuit mechanically bond and thereby electrically connect each plunger to a corresponding circuit trace on the flex circuit. The end of the flex circuit terminates inside the connector housing with separation lines 146 between adjacent plungers that divide the end portion of the flex circuit into independently flexible fingers 148 to which the corresponding plungers are secured. The flex circuit overlies the rigid supporting surface provided by the upper surface 150 of the pin housing, and the flexible fingers are generally in the plane lying flat upon the supporting surface 150, as shown in FIG. 9. An alternate embodiment shown in FIGS. 10 and 11, and described in more detail below, uses a different arrangement of the flex circuit. A thin, flexible elastomeric diaphragm 152 is in direct pressure contact with the heads of the plungers in the normal position of the connector. A housing cover 154 secures to the peripheral end portions of the elastomeric diaphragm and holds the elastomeric diaphragm in pressure contact against the top surfaces of the plungers in the normal position of the connector. The housing cover includes a void space above the compliancy control ends of the plungers for receiving the flexible diaphragm when it is stretched under axial force applied to the end of the plungers. In one embodiment a common void space is located above all plungers; in an alternative embodiment separate isolated void spaces are used, as in the embodiment of FIG. 8.

Figure 10:
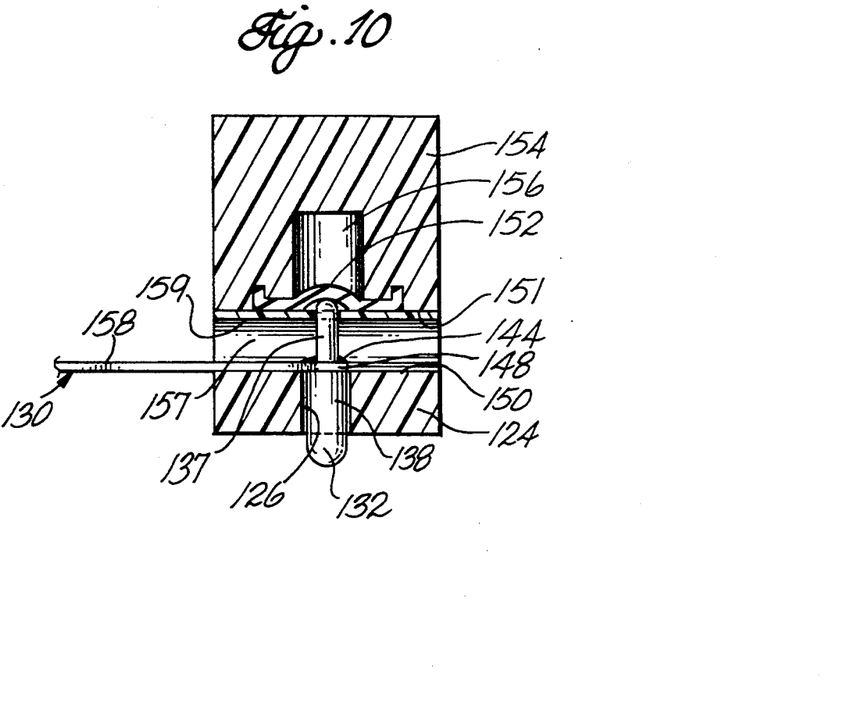
FIG. 10 is a cross-sectional view showing the springless compliant connector, which is an alternative embodiment of the connector of FIG. 9, in a normal position.
Figure 11:
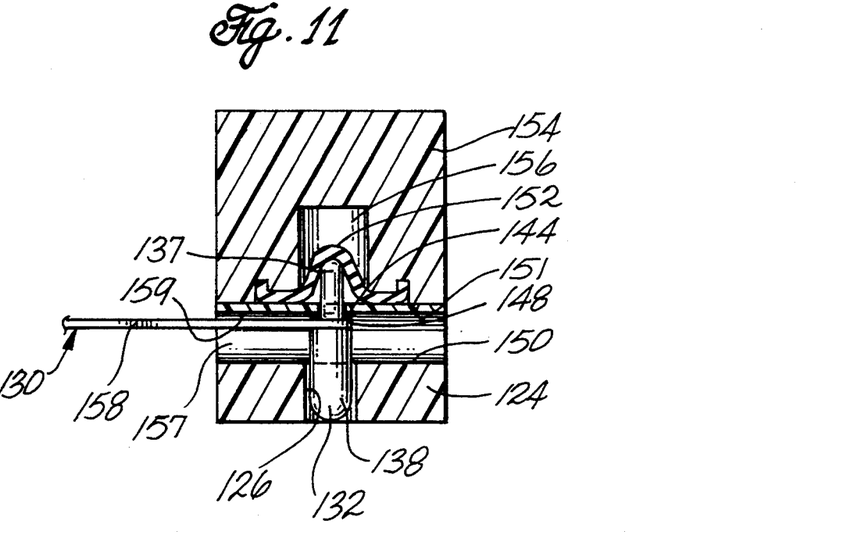
FIG. 11 is a cross-sectional view of the connector of FIG. 10 in an actuated position.

FIGS. 10 and 11 are cross-sectional views showing an alternative embodiment of the connector of FIG. 9. Referring to the normal position of the FIG. 10 connector, the plunger (or contact pins) 138 each include a narrow compliancy control end 137 held in pressure contact with the underside of the elastomeric diaphragm 152. The housing cover 154 includes an open space 157 between the flat top surface 150 of the pin housing 124 and the spaced apart, parallel, flat rigid bottom surface 151 of the housing cover to which the elastomeric diaphragm 152 is secured. The flex circuit 130 in the FIG. 10 embodiment includes the flexible fingers 148 having the circuit traces electrically connected to the respective contact pins by the individual solder joints 144. The flex circuit is freely movable within the open space 157 in response to travel of the contact pins. A thin, flat, rigid dielectric sheet 159 is rigidly secured to the underside of the downwardly facing surface 151 of the housing cover. This dielectric sheet secures the elastomeric diaphragm in a fixed position supported against the flat, rigid surface 151 and normally held in pressure contact with the top ends 137 of the contact pins.

FIG. 11 illustrates the stretched position of the diaphragm under such an axial force applied to a plunger. Since the plungers are independently secured to the corresponding fingers 148 of the flex circuit, each flex circuit finger is able to flex independently with the travel of the plunger into the void space 157. Travel of the diaphragm is accommodated by the void spaces 156. In normal use the distance of pin travel is relatively small, on the order of about 0.030 inch, but the stretching of the diaphragm is sufficient to provide a good level of spring biased force to the contact ends of the plungers. A terminal end portion 158 of the flex circuit projects freely away from the housing for connection to an external electrical/electronic device.

Figure 12:
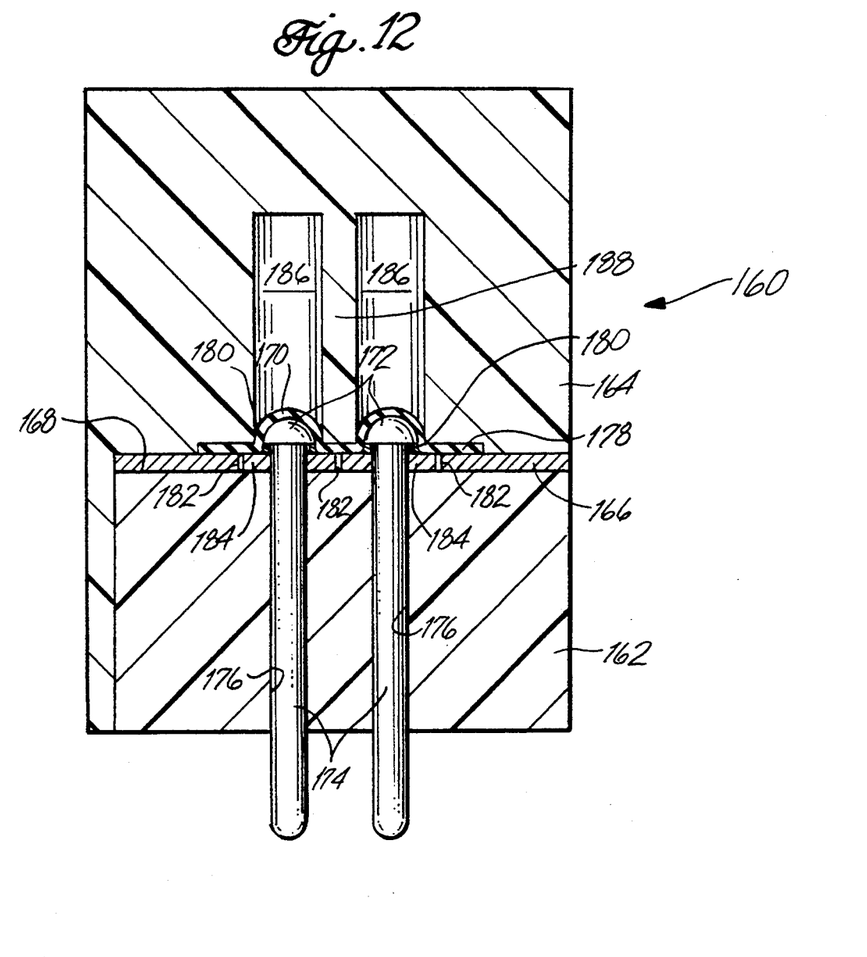
FIG. 12 is a cross-sectional view of an alternative embodiment of a compliant connector.

FIG. 12 shows an alternative embodiment of a connector 160 similar to the connectors shown in FIGS. 9 through 11 but with the configuration of the pin housing, the cover, and the plungers modified. The connector 160 includes the dielectric pin housing 162 and its cover 164 for securing a flex circuit 166 in a fixed position against the rigid supporting surface 168. The thin, flexible elastomeric diaphragm 170 overlies and is in direct contact with the head portions 172 of plungers 174 movably disposed within passages 176 of the pin housing. A peripheral portion 178 of the diaphragm is secured in place by the interior of the housing cover 164 which secures the outer peripheral portion of diaphragm against the top of the flex circuit. Solder joints 180 mechanically bond and electrically connect the top portions of the contact pins to the individual circuit traces of the flex circuit. Separation lines 182 at terminal portions of the flex circuit divide the flex circuit into flexible fingers 184 to which the individual contact pins are secured.

During use, an axial force directed to either of the contact pins moves one pin independently of the other, and the individual fingers of the flex circuit to which the contact pins are secured also are able to flex independently with the travel of the contact pin. The housing cover contains the void spaces 186 electrically isolated from one another by a wall 188 of the housing cover. The bottom of this separating wall applies a downward retaining force to the top of flexible diaphragm to hold it securely in place against the top of the flex circuit which in turn is supported by the supporting surface 168 of the pin housing.

Figure 13:
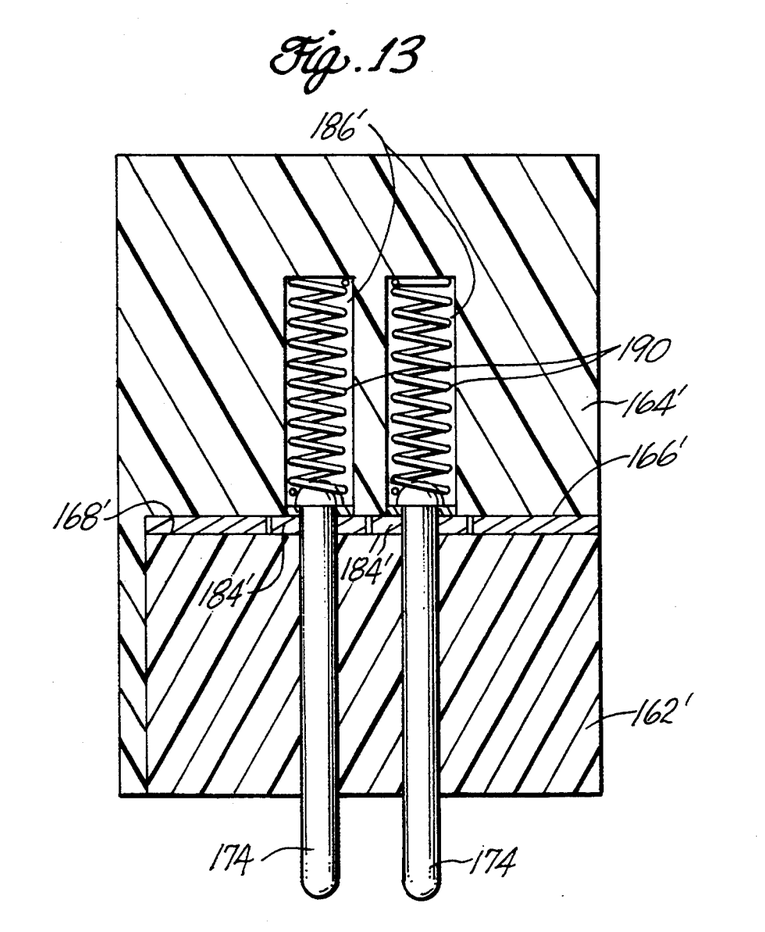
FIG. 13 is a cross-sectional view of an alternative embodiment of the connector shown in FIG. 12.

FIG. 13 is an alternative form of the connector shown in FIG. 12 in which individual coil springs 190 contained within the void spaces 186' provide a biasing force for the contact pins 174.

Figure 14:
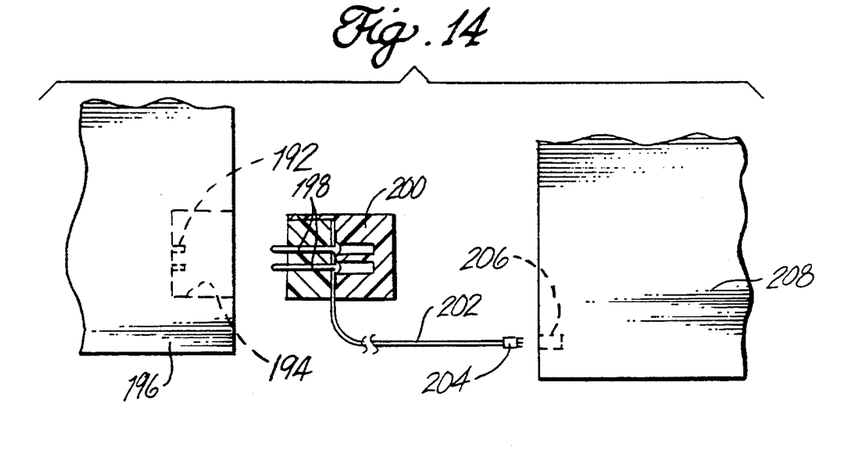
FIG. 14 is a schematic view illustrating use of the connectors of FIGS. 7 through 13 as a connector between an ink-jet cartridge and an ink-jet printer.

FIG. 14 is a schematic view illustrating one use of the connectors shown in FIG. 7 through 13 in which the spring biased pins of the connector are engaged with corresponding hard contacts 192 contained within a receptacle 194 of a first electrical/electronic device 196. The contact pins 198 on the connector 200 of this invention make spring biased contact with the contacts 192 when the contact housing is inserted into the receptacle and held in place to retain the spring biased contact. The opposite end of the connector includes the flex circuit film 202 with a terminal connector 204 that plugs into a receptacle 206 contained in a second electrical/electronic device 208.

The connector of this invention has advantages over prior art compliant connectors. In one prior art connector design, compliancy is provided by a large compressible rubber block or by a compressible rubber pad that is compressed against a flex circuit and the contact pins by a metal spring and a rigid force distributing plate. See, for example, U.S. Pat. Nos. 4,881,901 to Mendenhall et al. and 5,205,739 to Malo et al. which disclose these types of connectors. The embodiments of the present invention, which include the thin, flexible elastomeric diaphragm, provide an improvement over connectors using a compressible rubber block or a rubber pad normally subjected to spring pressure. Such compressible rubber compliant elements can take a compression set during use; the rubber also can harden during use. As a result, connector compliance may be reduced. Loss of such compliance between the contact pins is especially critical. In these connectors, the flex circuit is also trapped between the rubber pad or block and the ends of the contact pins. When the contact pins contact a hard circuit board during use, the lack of compliance caused by the compression set and/or hardening of the rubber causes the flex circuit to be squeezed between the opposing hard contact forces.

In the present invention, compliancy is not produced by compression of a rubber element. Full flexibility of the compliant forces applied through the contact pins is retained because the thin, flexible rubber diaphragm contacts the contact pins directly and is free to stretch elastically into the void space. The void space is devoid of any means for applying a compression force to the rubber diaphragm in opposition to the travel of the contact pins. Thus, the compliant element of the connector of this invention is freely expandable to produce an independent biasing force to each contact pin during the life of the connector. In addition, the flex circuit that contacts the pins is not adversely affected by having contact forces applied directly to it during use. This avoids undesired hard contact forces applied when the contact pins are pushed against a hard contact surface during use. The present invention also provides a connector which can be easily assembled with a minimum of active components, which reduces labor and materials costs. The response function of the connector during use also is enhanced because the elastomeric diaphragm is constantly available to apply opposing spring biasing forces directly to the contact pins without requiring intervening force applying members.

What is claimed is:

1. A compliant electrical connector for making electrical contact with terminals on a first electrical/electronic device and spring force electrical contact with fixed contacts of a second electrical/electronic device, the compliant connector comprising:
   a rigid pin housing made from a dielectric material and including an exterior face having a plurality of openings to passages for containing electrical contact pins and a hollow interior region having a rigid support surface spaced from the exterior face of the housing;
   a plurality of contact pins extending through respective passages in the pin housing which support the contact pins in a pattern corresponding to the contacts of the second electrical/electronic device, a contact end of each supported contact pin being aligned for contact with a corresponding contact of the second electrical/electronic device, each contact pin having an opposite compliancy control end adjacent the interior support surface of the housing;
   a thin, flexible elastomeric diaphragm normally held in a first position supported by the interior support surface of the pin housing, the diaphragm contacting the compliancy control ends of the contact pins, the hollow interior of the pin housing having a void space on a side of the diaphragm opposite from the contact pins so the elastomeric diaphragm is free to stretch elastically and expand into the void space in response to movement of each contact pin under an axial force directed toward the diaphragm; and
   a thin, flexible dielectric film containing passive electrical termination leads, the film supported by the interior support surface and disposed between the interior support surface and the flexible diaphragm, the termination leads being individually electrically coupled to corresponding contact pins, the flexible film extending to the exterior of the housing for connection of its leads to the first electrical/electronic device.

2. The connector according to claim 1 in which the first electrical/electronic device is a circuit in a battery operated cellular telephone and the second electrical/electronic device is a battery.

3. The connector according to claim 1 in which the passive circuits are connected directly to the individual contact pins and the flexible film includes individual separation lines for increasing flexibility of the film in response to travel of a particular contact pin disposed between the separation lines, said movement being independent of other portions of the same film between other pairs of separation lines.

4. Apparatus according to claim 1 including a separate conductive barrel in each passage, in which each contact pin makes electrical contact with a corresponding conductive barrel, and in which each passive termination lead is electrically coupled to a corresponding conductive barrel.

5. An electrical connector for making releasable electrical contact with a mating electrical connector having a plurality of fixed electrical contacts, the compliant electrical connector comprising:
   a rigid electrically insulative housing containing a plurality of separate passage extending through the housing and opening through an internal support surface within the housing;
   separate movable electrically conductive contact pins disposed in the respective passages of the housing, the contact pins having contact ends projecting from an exterior face of the housing for alignment with corresponding fixed electrical contacts on the mating electrical connector, the separate contact pins being freely movable independently within the passages of the housing in a direction away from said exterior face of the housing, the contact pins having compliancy control ends opposite from the contact ends thereof;
   a thin, flexible elastomeric diaphragm supported in the housing by said internal support surface and maintained in direct contact with the compliancy control ends of the contact pins;
   a rigid electrically insulative end cap secured to the housing and securely retaining the flexible elastomeric diaphragm in said supported position in contact with the contact pins, the end cap containing an internal cavity forming an open space on a side of the diaphragm opposite from the compliancy control ends of the movable contact pins so that the diaphragm is elastically stretchable freely into the open space within the cavity in response to axial pressure contact from each contact pin moving axially in the passage toward the diaphragm; and
   terminal means comprising a plurality of separate electrically conductive passive leads disposed within the housing between the elastomeric diaphragm and said interior support surface within the housing, including means electrically connecting each electrical lead to a corresponding contact pin at a juncture near said internal support surface of the housing and below the compliancy control end of the contact pin and its point of contact with the diaphragm, said passive electrical leads extending to the exterior of the housing for connection to an electrical/electronic device to be interfaced with a separate electrical/electronic device contacted by the contact pins, the contact pins being separate and independently slidable in their respective passages into the elastomeric diaphragm for producing and retaining a spring biased means of electrical contact with said cooperating fixed electrical contacts on the mating electrical connector, the diaphragm being stretched freely into said open space to produce said spring biasing force on each movable contact pin for producing a high reliability electrical connection between the biased contact pin and its cooperating electrical contact.

6. Apparatus according to claim 5 in which the external electrical/electronic device comprises a printed circuit board containing printed circuits, and the electrical leads of the terminal means are surface mounted to the printed circuits on the printed circuit board, and the housing of the electrical connector is mounted in a fixed position on the printed circuit board so its contact pins face away from an edge of the board.

7. Apparatus according to claim 5 including separate cavities formed in the end cap which are independently isolated from one another so that each contact pin freely moves independently into a corresponding cavity to stretch the diaphragm without stretching the diaphragm at its point of contact with an adjacent non-moving contact pin.

8. Apparatus according to claim 5 in which the first and second electrical/electronic devices comprise an ink jet cartridge and an ink jet printer.

9. Apparatus according to claim 5 in which the terminal means comprise solid metal leads making wiping contact in the passages with the respective contact pins, and in which the solid metal leads extend to the exterior of housing and are rigidly affixed thereto in a position to make surface mount contact with an external electrical/electronic device comprising a printed circuit board or the like.

10. Apparatus according to claim according to claim 5 in which the electrical terminal means comprise a flexible dielectric film with passive printed circuits that provide said electrical leads.

11. Apparatus according to claim 10 in which the compliancy control ends of the contact pins have enlarged heads protruding above the flexible dielectric film and in direct pressure contact with the elastomeric diaphragm.

12. Apparatus according to claim 10 in which the flexible dielectric film extends flexibly away from the housing of the electrical conductor and includes an electrical terminal connector at its free end.

13. Apparatus according to claim 12 in which the electrical terminal means include separate electrically conductive barrels disposed in each passage, with the contact pins being slidable axially within the respective passages, and in which each barrel is rigidly and electrically connected to corresponding passive electrical circuit on the flexible dielectric film.

14. A passive circuits are rigidly bonded and thereby electrically connected to the individual contact pins.

15. Apparatus according to claim 14 in which the flexible dielectric film contains slitted regions adjacent the connections to the contact pins for enhancing flexibility of the film internally within the housing for accommodating movement of the film in response to corresponding independent movement of each contact pin.

16. A compliant electrical connector for making electrical contact with terminals on a first electrical/electronic device and spring force electrical contact with fixed contacts of a second electrical/electronic device, the compliant connector comprising:

a rigid pin housing made from a dielectric material and including an exterior face having a plurality of openings to passages for containing electrical contact pins and a hollow interior region having a rigid support surface spaced from the exterior face of the housing;

a plurality of contact pins extending through respective passages in the pin housing which support the contact pins in a pattern corresponding to the contacts of the second electrical/electronic device, a contact end of each supported contact pin being aligned for contact with a corresponding contact of the second electrical/electronic device, each contact pin having an opposite compliancy control end adjacent the interior support surface of the housing, the housing containing a plurality of electrically isolated internal void spaces aligned with the compliancy control ends of the contact pins;

separate control springs disposed within the internal void spaces and normally biased against the corresponding compliancy control ends of the contact pins, each control spring providing an independent means of compliancy for each contact pin in response to movement of each contact pin under an axial force directed toward its control spring; and a thin, flexible dielectric film containing passive electrical termination leads, the film supported by the interior support surface in the housing, the termination leads being individually electrically coupled to corresponding contact pins, the flexible film extending to the exterior of the housing for connection of its leads to the first electrical/electronic device.

17. The connector according to claim 16 in which the first electrical/electronic device is a circuit in a battery operated cellular telephone and the second electrical/electronic device is a battery.

18. The connector according to claim 16 in which the passive circuits are connected directly to the individual contact pins and the flexible film includes individual separation lines for increasing flexibility of the film in response to travel of a particular contact pin disposed between the separation lines, said movement being independent of other portions of the same film between other pairs of separation lines.

19. Apparatus according to claim 16 including a separate conductive barrel in each passage, in which each contact pin makes electrical contact with a corresponding conductive barrel, and in which each passive termination lead is electrically coupled to a corresponding conductive barrel.

20. An electrical connector for making releasable electrical contact with a mating electrical connector having a plurality of fixed electrical contacts, the compliant electrical connector comprising:

a rigid electrically insulative housing containing a plurality of separate passages extending through the housing and opening through an internal support surface within the housing;

separate movable electrically conductive contact pins disposed in the respective passages of the housing, the contact pins having contact ends projecting from an exterior face of the housing for alignment with corresponding fixed electrical contacts on the mating electrical connector, the separate contact pins being freely movable independently within the passages of the housing in a direction away from said exterior face of the housing, the contact pins having compliancy control ends opposite from the contact ends thereof, the housing containing a plurality of electrically isolated internal void spaces aligned with the compliancy control ends of the contact pins;

separate control springs disposed within the internal void spaces and normally biased against the corresponding compliancy control ends of the contact pins, each control spring providing an independent means of compliancy for each contact pin;

a rigid electrically insulative end cap secured to the housing and securely retaining a flexible elastomeric diaphragm in said supported position in contact with the contact pins, the end cap containing said internal void spaces so that each control spring provides compliancy in response to axial pressure contact from each contact pin moving axially in the passage toward its control spring; and terminal means comprising a plurality of separate electrically conductive passive leads disposed within the housing on said interior support surface within the housing, including means electrically connecting each electrical lead to a corresponding contact pin at a juncture near said internal support surface of the housing and below the compliancy control end of the contact pin and its point of contact with its control spring, said passive electrical leads extending to the exterior of the housing for connection to an electrical/electronic device to be interfaced with a separate electrical/electronic device contacted by the contact pins, the contact pins being separate and independently slidable in their respective passages into the elastomeric diaphragm for producing and retaining a spring biased means of electrical contact with said cooperating fixed electrical contacts on the mating electrical connector, the control springs being movable into said open space to produce a spring biasing force on each movable contact pin for producing a high reliability electrical connection between the biased contact pin and its cooperating electrical contact.

21. Apparatus according to claim 20 in which the external electrical/electronic device comprises a printed circuit board containing printed circuits, and the electrical leads of the terminal means are surface mounted to the printed circuits on the printed circuit board, and the housing of the electrical connector is mounted in a fixed position on the printed circuit board so its contact pins face away from an edge of the board.

22. Apparatus according to claim 20 including separate cavities formed in the end cap which are independently isolated from one another so that each contact pin freely moves independently into a corresponding cavity to stretch the diaphragm without stretching the diaphragm at its point of contact with an adjacent non-moving contact pin.

23. Apparatus according to claim 20 in which the first and second electrical/electronic devices comprise an ink jet cartridge and an ink jet printer.

24. Apparatus according to claim 20 in which the terminal means comprise solid metal leads making wiping contact in the passages with the respective contact pins, and in which the solid metal leads extend to the exterior of housing and are rigidly affixed thereto in a position to make surface mount contact with an external electrical/electronic device comprising a printed circuit board or the like.

25. Apparatus according to claim 20 in which the electrical terminal means comprise a flexible dielectric film with passive printed circuits that provide said electrical leads.

26. Apparatus according to claim 25 in which the compliancy control ends of the contact pins have enlarged heads protruding above the flexible dielectric film and in direct pressure contact with the elastomeric diaphragm.

27. Apparatus according to claim 25 in which the passive circuits are rigidly bonded and thereby electrically connected to the individual contact pins.

28. Apparatus according to claim 27 in which the flexible dielectric film contains slitted regions adjacent the connections to the contact pins for enhancing flexibility of the film internally within the housing for accommodating movement of the film in response to corresponding independent movement of each contact pin.

29. Apparatus according to claim 25 in which the flexible dielectric film extends flexibly away from the housing of the electrical conductor and includes an electrical terminal connector at its free end.

30. Apparatus according to claim 29 in which the electrical terminal means include separate electrically conductive barrels disposed in each passage, with the contact pins being slidable axially within the respective passages, and in which each barrel is rigidly and electrically connected to corresponding passive electrical circuit on the flexible dielectric film.

* * * * *

UNITED STATES PATENT AND TRADEMARK OFFICE
CERTIFICATE OF CORRECTION

PATENT NO. : 5,447,442
DATED : September 5, 1995
INVENTOR(S) : Mark A. Swart

It is certified that error appears in the above-indentified patent and that said Letters Patent is hereby corrected as shown below:

```
Column 3, line 21, change "each the cavity" to
          -- each cavity --.
Column 3, line 61, change "shown on FIG. 3" to
          -- shown in FIG. 3. --.
Column 6, line 41, after "portions" insert -- of --.
Column 6, line 61, change "FIG. 3 through 5" to
          -- FIGS. 3 through 5 --.
Column 8, line 34, change "complimentary" to
          -- complementary --.
Column 11, lines 27,28, change "materials" to
          -- material --.
Column 12, line 30, change "passage" to -- passages --.
Column 13, line 39, before "housing" insert -- the --.
Column 13, line 62, change "circuit" to -- circuits --.
Column 13, line 63, delete "Appassive" and insert therefor
          -- Apparatus according to claim 10, in which
          the passive --.
Column 16, line 19, before "housing" insert -- the --.
```

Signed and Sealed this

Twenty-fifth Day of June, 1996

Attest:

BRUCE LEHMAN

Attesting Officer

Commissioner of Patents and Trademarks